United States Patent [19]
Shimizu

[11] Patent Number: 5,593,906
[45] Date of Patent: Jan. 14, 1997

[54] METHOD OF PROCESSING A POLYSILICON FILM ON A SINGLE-CRYSTAL SILICON SUBSTRATE

[75] Inventor: Junzoh Shimizu, Tokyo, Japan

[73] Assignee: NEC Corporation, Tokyo, Japan

[21] Appl. No.: 489,234

[22] Filed: Jun. 12, 1995

Related U.S. Application Data

[63] Continuation of Ser. No. 28,428, Mar. 9, 1993, abandoned.

[30] Foreign Application Priority Data

Mar. 9, 1992 [JP] Japan ................................. 4-050218

[51] Int. Cl.$^6$ ...................... H01L 21/306; H01L 21/328
[52] U.S. Cl. ................ 437/31; 437/52; 437/986; 156/657.1; 156/643.1
[58] Field of Search ................ 437/31, 52, 986; 156/643.1, 657.1, 628, 644.1, 646.1, 653.1

[56] References Cited

U.S. PATENT DOCUMENTS

| | | | |
|---|---|---|---|
| 4,479,850 | 10/1984 | Beinvogl et al. | 156/643 |
| 5,126,231 | 6/1992 | Levy | 430/313 |
| 5,279,990 | 1/1994 | Sun et al. | 437/195 |

FOREIGN PATENT DOCUMENTS

| | | | |
|---|---|---|---|
| 0056530 | 7/1982 | European Pat. Off. | |
| 401786 | 12/1990 | European Pat. Off. | |
| 1-291446 | 11/1989 | Japan | 437/986 |

OTHER PUBLICATIONS

Samukawa, S., et al., "Ion Energy Distributions". . . Jpn. J. Appl. Phys. Lett., vol. 29(12), Dec. 1990, pp. L2319–L2321.
Samukawa, S., et al., "Extremly high–selective . . . " Appl. Phys. Lett., 57(4), 23 Jul. 1990, pp. 403–405.
Bennett., R., "Highly selective Plasma . . . ", IBM TDB, vol. 24, No. 12, May 1982, pp. 6278–6279.
Wolf, S., et al., Silicon Processing for the VLSI . . . , Lattice Press, 1986, pp. 175–182, pp. 312–327.
"Solid State Technology", vol. 27, No. 4, Apr. 1984, pp. 225–228.
Samukawa, S., "Extremely highly–selective . . . ", Appl. Phys. Lett., 57(4), 23 Jul. 1990, pp. 403–405.
Bennett, R., "Highly Selective Plasma Etching . . . ", IBM Tech. Disc. Bull., 24(12), May 1982, pp. 6278–6279.
Wolf, S., et al., Silicon Processing for the VLSI Era, Lattice Press, 1986, pp. 175–182, pp. 312–327.

Primary Examiner—T. N. Quach
Attorney, Agent, or Firm—Laff, Whitesel, Conte & Saret, Ltd.

[57] ABSTRACT

A method of processing a polysilicon film formed on a single-crystal silicon substrate which can remove the polysilicon film with good selectivity in a fabrication process of semiconductor devices. First, a polysilicon film having an N-portion to be removed is formed on a single-crystal silicon substrate and then, the portion is selectively removed by the reactive ion etching using a $Cl_2$ gas or mixed gases including a $Cl_2$ gas. Preferably, N-impurity doping into the polysilicon film is performed by P or As ion-implantation with a dose of $1\times10^{15}$ cm$^{-2}$ or more. A $Cl_2$ gas, mixed gases of $Cl_2$ and $BCl_3$, mixed gases of $Cl_2$ and HBr, mixed gases of $Cl_2$ and $BBr_3$, and mixed gases of $Cl_2$ and $SiCl_4$ are preferably used.

9 Claims, 3 Drawing Sheets ized a P+-polysilicon film 3 having a thickness of 200 to 300 nm is deposited, and on the film 3 a silicon dioxide film 4 having a thickness of 200 to 300 nm is deposited.
METHOD OF PROCESSING A POLYSILICON FILM ON A SINGLE-CRYSTAL SILICON SUBSTRATE This application is a continuation of application Ser. No. 08/028,428, filed Mar. 9, 1993, abandoned.

BACKGROUND OF THE INVENTION

1. Field of the Invention

The present invention relates to a method of processing a polysilicon film and more particularly, to a method of processing a polysilicon film formed on a single-crystal silicon substrate, which is used in a fabrication process of a semiconductor device such as a bipolar transistor and an MOS transistor.

2. Description of the Related Art

Recently, a selective etching technique of a polysilicon film on a single-crystal silicon substrate has become very important in LSI fabrication. The technique is used for forming an emitter opening during the fabrication of a bipolar transistor having a polysilicon base electrode connected to a graft base. This technique will be described concretely below referring to FIG. 1.

FIG. 1 shows a step of fabrication process of a bipolar transistor in which the above-described conventional technique is used.

In FIG. 1, silicon dioxide films 2 for isolation are formed on a single-crystal silicon substrate 1 by selective oxidization. On the surfaces of the films 2 and the exposed surface of the substrate 1, a P+-polysilicon film 3 having a thickness of 200 to 300 nm is deposited, and on the film 3 a silicon dioxide film 4 having a thickness of 200 to 300 nm is deposited.

In an active region formed by the oxide films 2 of the substrate 1, a graft base area 6 is formed near the surface of the substrate 1 and an emitter opening is formed in the oxide film 4 and the polysilicon film 3. The polysilicon film 3 is patterned to form a base electrode.

An N-emitter region 8 and a P-active base region 7 are formed in a portion of the substrate which is facing the emitter opening. In the emitter opening, a side wall 10 of a silicon dioxide film is formed on the side surfaces of the polysilicon film 3 and the silicon dioxide film 4, and an emitter electrode 9 of an N+-polysilicon film is formed on the surfaces of the sidewall 10, the emitter region 8 and the silicon dioxide film 4.

The bottom end of the emitter opening should be positioned at a level which is almost the same as that of the substrate 1 (or the graft base region 6) so that the graft base region 6 and the active base region 7 may be connected to each other; however, in FIG. 1, the bottom end of the emitter opening is positioned near the bottom end of the graft base region 6 due to overetching. In addition, the bottom end of the spacer 10 is nearly extended to the bottom end of the graft base region 6.

In the process of forming the emitter opening, first, an unmasked portion of the silicon dioxide film 4 is selectively removed by the anisotropic etching technique such as the reactive-ion etching (RIE) technique using a fluorine gas or the like. Therefore, a portion of the polysilicon film 3 thus exposed is selectively removed by the anisotropic etching technique such as the RIE technique using a chlorine gas or the like.

In this process, it is impossible to selectively etch one of the P+-polysilicon film 3 and the single-crystal silicon substrate 1. Besides, it is extremely difficult to etch the polysilicon film 3 without etching the substrate 1 with regard to the present etching rate stability and etching uniformity. Accordingly, the polysilicon film 3 tends to remain partially on the substrate 1 due to insufficient etching, or the substrate 1 tends to be overetched.

If the polysilicon film 3 partially remains on the substrate 1, a problem arises because the emitter region 8 and the graft base region 6 are short-circuited to each other through the remainder of the film 3.

If the substrate 1 is overetched a, sufficient interconnection between the graft base region 6 and the active base region 7 cannot be obtained, as shown in FIG. 1. As a result, a problem arises because the base resistance will increase and punch through will occur between the emitter region 8 and a collector region (not shown).

The above-described process of selective etching of the polysilicon film is also used in a process of forming a node portion of a memory cell of static random access memory (SRAM) composed of MOS transistors.

FIG. 2 shows a step in the fabrication process of an SRAM in which the above-described conventional etching technique is used.

As shown in FIG. 2, silicon dioxide films 12 for isolation are formed on a single-crystal silicon substrate 11 by selective oxidation. In an active region formed by the oxide films 12 of the substrate 1, the surface area of the substrate 11 is covered with a silicon dioxide film 15, as a gate insulator. The film 15 is selectively removed at a node portion N of an SRAM memory cell. A gate electrode 16 of a N+-polysilicon film is formed on the film 15. A source region 13 and a drain region 14 are formed in the substrate 11 in self-alignment with respect to the gate electrode 16. The surface of the substrate 11 is partially exposed from the film 15 at the node portion N, and at the exposed area of the substrate 11, a concavity A is formed by etching.

The reason why the concavity A is formed is as follows: during the selective etching process of the polysilicon film to form the gate electrode 15, the etching action affects the exposed surface area of the substrate 11. Besides, the etching rate of the phosphorus diffusion region in the substrate 11, that is the source region 13 and the drain region 14 in FIG. 2, is larger than the etching rate of the other region. Therefore, the exposed surface area of the substrate 11 at the node portion N is easy to be etched.

Since the concavity A induces crystal defects in the substrate 11, a problem arises because a minute node leakage occurs to degrade the data storing characteristic of the SRAM.

SUMMARY OF THE INVENTION

Accordingly, an object of the present invention is to provide a method of processing a polysilicon film formed on a single-crystal silicon substrate which can remove the polysilicon film with good selectivity.

The method, according to the present invention, comprises a step for preparing on a single-crystal silicon substrate a polysilicon film which has an N-portion to be removed, and a step of selectively removing the portion by a reactive ion etching technique using a chlorine ($Cl_2$) gas or gases including a chlorine ($Cl_2$) gas.

With the method of the present invention, an etching rate of N-polysilicon can be made 1.5 to 2 times as large as that of P- or I- (no impurity-doped) polysilicon or single-crystal silicon, so that only the N-portion of the polysilicon film can be removed by the etching without the substrate being adversely affected. As a result, the polysilicon film can be processed with good selectivity.

The substrate may be N-, P- or I-single-crystal silicon.

Preferably, the step of preparing the polysilicon film is realized by forming a P- or I- polysilicon film on the substrate and doping N-impurity into the entirety or part of the polysilicon film. This step may be performed by forming a polysilicon film in which N-impurity is entirely or partially doped on the substrate.

The impurity concentration of the N-portion of the polysilicon film may be set according to a necessary condition for etching.

Preferably, an N-impurity doping into the polysilicon film is performed by phosphorus or arsenic ion-implantation with a dose of $1 \times 10^{15}$ cm$^{-2}$ or more.

In the step of selectively removing the portion, the reactive ion etching may be performed under the ordinary condition.

As the etching gas, the following gas or mixed gasses may be used:

a chlorine ($Cl_2$) gas;

mixed gases of $Cl_2$ and boron chloride ($BCl_3$);

mixed gases of $Cl_2$ and hydrogen bromide (HBr);

mixed gases of $Cl_2$ and boron bromide ($BBr_3$); and mixed gases of $Cl_2$ and silicon chloride ($SiCl_4$).

In a preferred embodiment, the polysilicon film forms a P-base electrode of a bipolar transistor and the N-portion of the polysilicon film is a portion to be removed for forming an emitter opening.

In another preferred embodiment, the polysilicon film forms a gate electrode of an MOS transistor and the N-portion of the polysilicon film is a portion where a node of an MOS-RAM is to be formed.

DESCRIPTION OF THE PREFERRED EMBODIMENTS

A preferred embodiment of the present invention will be described below while referring to FIGS. 3A to 3D and 4A to 4C.

First Embodiment

FIGS. 3A to 3D show a fabrication process of a bipolar transistor using a method of a processing a polysilicon film according to a first embodiment of the present invention.

Figure 3A:
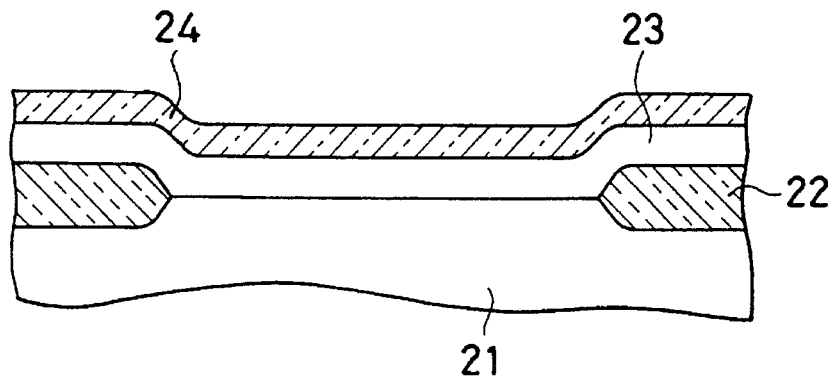
FIGS. 3A to 3D are cross-sectional views showing a method of processing a polysilicon film according to a first embodiment of the present invention.

First, as shown in FIG. 3A, a surface of a single-crystal silicon substrate 21 is selectively oxidized to form silicon dioxide ($SiO_2$) films 22 for device isolation on the surface. Then, a polysilicon film 23 having a thickness of 100 to 200 nm is formed on the surface of the oxide films 22 and the exposed surface of the substrate 21. Thereafter, the polysilicon film 23 is patterned so as to form a base electrode.

After boron (B) or boron fluoride ($BF_2$) is ion-implanted into the entire polysilicon film 23 to make it P$^+$-type, a silicon dioxide film 24 having a thickness of 200 to 300 nm is formed on the film 23 by the chemical vapor deposition (CVD) technique.

Figure 3B:
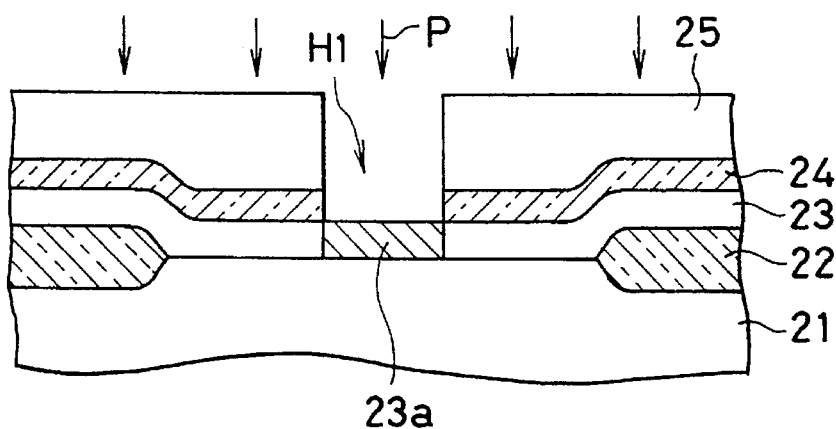
Figure 3C:
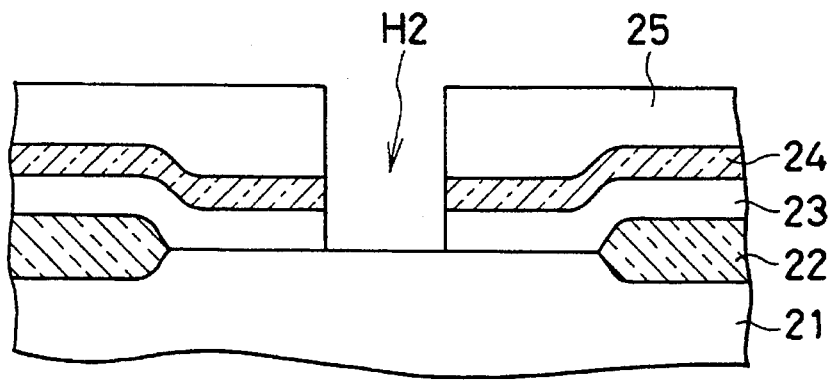

Next, as shown in FIG. 3B, a photoresist film 25 with a hole H1 is formed on the oxide film 24 to form an emitter region. The oxide film 24 is selectively removed to expose the surface of the P$^+$-polysilicon film 23 by the anisotropic etching technique using the photoresist film 25 as a mask.

Subsequently, Phosphorus (P) is selectively ion-implanted into a portion 23a facing the opening H1 of the polysilicon film 23 to make it N-type using the same film 25 as a mask. In this process, an appropriate energy and a dose of the ion-implantation change dependent on the thickness of the P$^+$-polysilicon film 23. For example, in case of the thickness of the film 23 being 200 nm, appropriate energy ranges may be from 40 to 50 keV and appropriate dose ranges may be from $1 \times 10^{15}$ to $5 \times 10^{15}$ cm$^{-2}$. If ion-implantation is performed under the above condition, implanted ions are distributed in the portion 23a and its neighboring area. The depth of the ion-distributed range is slightly smaller than the thickness of the film 23. Besides, the ion concentration in the portion 23a becomes $5 \times 10^{19}$ cm$^{-3}$ or more.

Arsenic (As) may be ion-implanted in place of Phosphorus. Which ion is to be used is determined according to the thickness of the polysilicon film 23.

Figure 1:
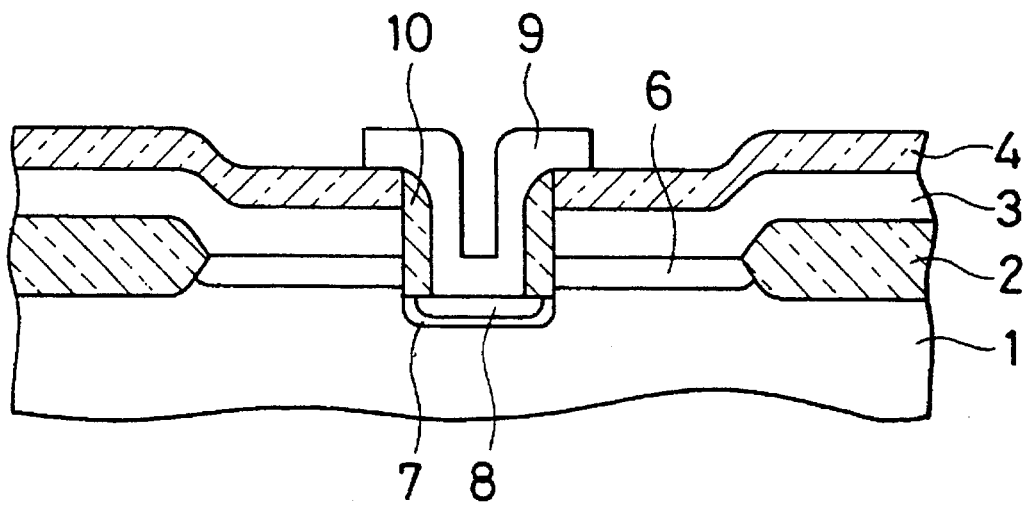
FIG. 1 is a cross-sectional view of a bipolar transistor in which an emitter opening is formed by a conventional etching method.

The N$^+$-portion 23a thus ion-implanted is then removed selectively by the reactive ion etching technique, using a $Cl_2$ 1 gas or mixed gases including a $Cl_2$ gas, to form a hole H2 extending to the surface of the substrate 21. The hole H2 is an emitter opening. The bottom end of the hole H2 is positioned at almost the same level of the surface of the substrate 21, and does not enter into the substrate 21 as shown in FIG. 1.

Since the ion concentration in the N$^+$-portion 23a of the polysilicon film 23 is $5 \times 10^{19}$ cm$^{-3}$ or more, the etching rate of the portion 23a can be made 1.5 to 2 times as large as the etching rate of the single-crystal silicon substrate 21, so that only the portion 23a can be removed by the etching process without the substrate 21 being affected adversely. As a result, the polysilicon film 23 can be removed with good selectivity even if the etching rate dispersion is large and/or etching uniformity is bad.

For example, in case of etching uniformity in a surface being ±10%, substantial etching dispersion can be made within ±3%.

Figure 3D:
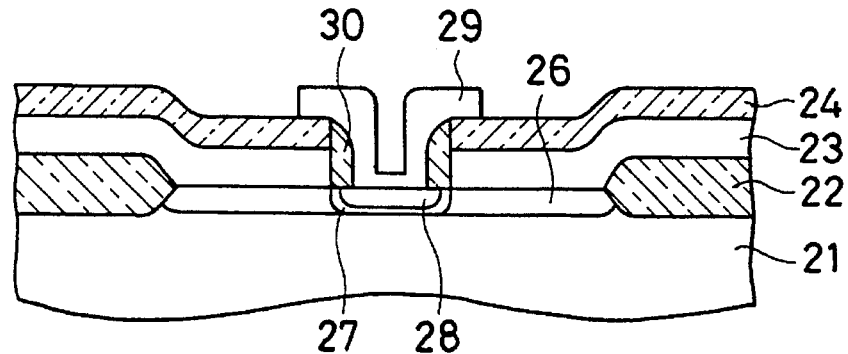

Next, P-impurities are selectively doped into the substrate 21 to form a P$^-$-graft base region 26 by diffusion from the inside of the P$^+$-polysilicon film 23 or ion-implantation through the film 23, as shown in FIG. 3D.

P-impurities are doped through the hole H2 into the substrate 21 to form a P-active base region 27. Thereafter, a sidewall 30 of silicon dioxide is formed on the side surfaces of the polysilicon film 23 and the silicon dioxide film 24.

Then, N-impurities are doped selectively through the hole H2 into the P-active base region 27 to form an N-emitter region 28, as shown in FIG. 3D. An emitter electrode 29 connected to the N-emitter region 28 is formed in the sidewall 30. The top end of the emitter electrode 29 is placed on the surface of the silicon dioxide film 24.

With the bipolar transistor thus fabricated, due to good etching selectivity, the polysilicon film 23 does not remain on the substrate 21 or on the bottom end of the emitter opening H2 which is positioned at almost the same level of the surface of the substrate 21, so that the graft base region 26 and the active base region 27 are well connected to each other. As a result, the problems generated in the conventional method do not arise, such as base resistance increase and punch through between the emitter and collector regions.

Fabricating bipolar transistors by using the method of the embodiment as a test, was found to yield almost 100% and was obtained in the emitter opening forming process.

Second Embodiment

Figure 4A:
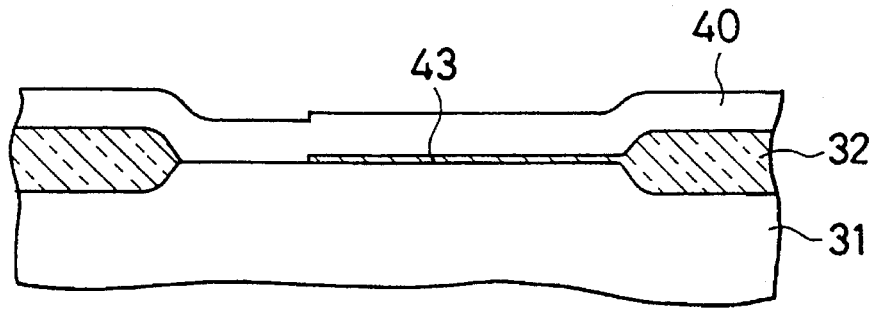
FIGS. 4A to 4C are cross-sectional views showing a method of processing a polysilicon film according to a second embodiment of the present invention.
Figure 4B:
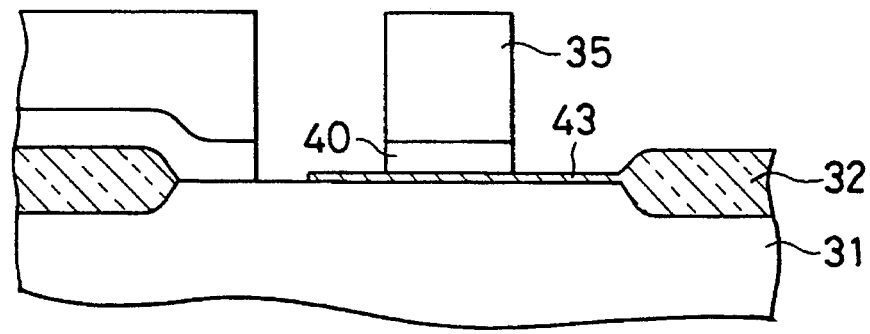
Figure 4C:
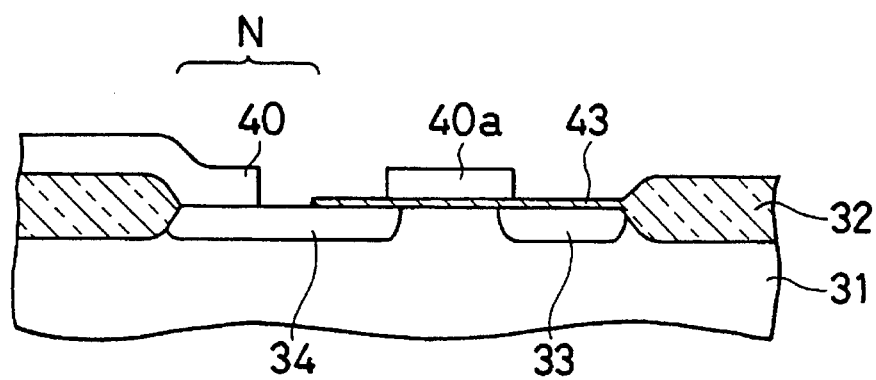

FIGS. 4A to 4C show a fabrication process of a CMOS-SRAM using a method of a processing a polysilicon film according to a second embodiment of the present invention.

First, a surface of a single-crystal silicon substrate 31 is selectively oxidized to form silicon dioxide ($SiO_2$) film 32 for device isolation on the surface. Then, a gate oxide film 43 having a thickness of 10 to 20 nm is formed on an exposed surface of the substrate 31.

Next, the gate oxide film 43 is partially removed to form a node portion N and a polysilicon film 40 having a thickness of 100 to 200 nm for a gate electrode is formed on the entire surface of the substrate 31.

P or As is ion-implanted into the polysilicon film 40 to make the film 4 $N^+$-type, as shown in FIG. 4A. The ion-implantation condition is set so that the ions may not be deeply implanted into the film 40. That is, implantation energy is set in the range from 20 to 30 keV in case of P and from 30 to 50 keV in case of As, and the dose is set as $1 \times 10^{15}$ $cm^{-2}$ or more in both cases.

Heat treatment at low temperature of 700° to 800° C. is performed to diffuse the implanted P or As ions in the polysilicon film 40. In this case, since the diffusion coefficient of the P or As ions in polysilicon is larger than that in single-crystal silicon, the ions diffuse uniformly in the polysilicon film 40 without diffusing into the single-crystal silicon substrate 31.

A photoresist film 35 is formed on the $N^+$-polysilicon film 40 and patterned as shown in FIG. 4B. Then, reactive ion etching of the film 40 in a $Cl_2$ gas or mixed gases including a $Cl_2$ gas is performed by using the patterned photoresist film 35 as a mask to form a gate electrode 40a.

Figure 2:
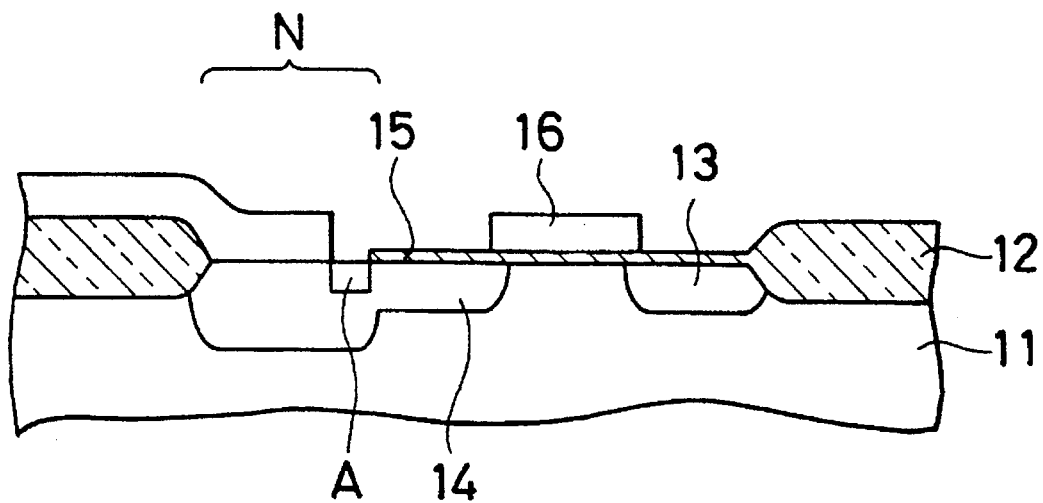
FIG. 2 is a cross-sectional view of an MOS transistor of a CMOS-SRAM in which a gate oxide film is selectively removed at a node portion by a conventional etching method.

Also in this embodiment, since the etching rate of $N^+$-polysilicon can be made 1.5 to 2 times as large as that of single-crystal silicon, only a portion of the film 40 can be selectively removed by the etching process without such a concavity as shown in FIG. 2 on the substrate 21.

Thereafter, as shown in FIG. 4C, a source region 33 and a drain region 34 are formed in self-alignment in the substrate 31 by the ion-implantation process as well as the P or As ions doped into the polysilicon film 40 are diffused into the node portion N in the substrate 31.

With the SRAM thus obtained, due to good etching selectivity, no concavity is formed in the substrate 31. As a result, the problem generated in the conventional method such as minute node leakage does not arise.

Fabricating a CMOS-SRAM of a high load resistance or a thin film transistor (TFT) types using the method of the embodiment as a test, it was found that no scattered node leakage was generated. As a result, the fabrication yield of good quality devices was improved by approximately 10% in the node portion forming process.

In the above embodiments, the method of the present invention is applied to a bipolar transistor. A SRAM, composed of MOS transistors, can also be applied to other semiconductor devices.

It is to be understood that the present invention is not limited to the embodiments except as defined in the appended claims.

What is claimed is:

1. A method of manufacturing a semiconductor device comprising the steps of:

(a) forming a P-type polysilicon film on and in contact with a major surface of a semiconductor substrate;

(b) forming a mask layer on said P-type polysilicon film, said mask layer having a hole which exposes said P-type polysilicon film;

(c) selectively introducing an N-type impurity into said P-type polysilicon film for forming an N-type region in said P-type polysilicon film, said N-type region extending through the entire thickness of said P-type polysilicon film; and (d) selectively removing said N-type region of said P-type polysilicon film by an anisotropic etching method using said mask layer as a mask, said etch continuing until said major surface of said substrate is exposed to form an opening in said P-type polysilicon film, said opening exposing said major surface of said substrate;

said N-type region of said P-type polysilicon film having an etching rate which is greater than an etch rate of said P-type polysilicon film so that the etching rate difference between said N-type region and said substrate becomes greater than the etch rate between said P-type polysilicon film and said substrate;

whereby said major surface of said substrate which is exposed by said opening of said P-type polysilicon film is not overetched during said step (d).

2. The method according to claim 1, wherein said step of introducing said N-type impurity into said part of said P-type polysilicon film is an implantation of ions of a material taken from a group consisting of phosphorus and arsenic, with a dose of at least $1 \times 10^{15}$ $cm^{-2}$.

3. The method according to claim 1, wherein said step of removing said N-type portion of said polysilicon film is performed by a reactive ion etching using a gas selected from the group consisting of a $Cl_2$ gas, mixed gases of $Cl_2$ and $BCl_3$, mixed gases of $Cl_2$ and HBr, mixed gases of $Cl_2$ and $BBr_3$, and mixed gases of $Cl_2$ and $SiCl_4$.

4. A method of manufacturing a semiconductor device comprising the steps of:

(a) depositing a P-type polysilicon film on and in contact with a major surface of a single-crystal silicon substrate;

(b) forming a mask layer on said P-type polysilicon film, said mask layer having a hole therein which exposes said P-type polysilicon film;

(c) selectively introducing an N-type impurity into said P-type polysilicon film through said hole of said mask layer for forming an N-type region in said P-type polysilicon film, said N-type region extending through the entire thickness of said P-type polysilicon film;

(d) selectively removing said N-type region of said P-type polysilicon film by an anisotropic etching method using said mask layer, said etch continuing until said major surface of said substrate is exposed to form an opening in said P-type polysilicon film, said opening exposing said major surface of said substrate;

said N-type region of said P-type polysilicon film having an etching rate which is greater than an etch rate of said P-type polysilicon film so that the etching rate difference between said N-type region and said substrate becomes greater than an etch rate between said P-type polysilicon film itself and said substrate;

whereby said major surface of said substrate which is exposed by said opening of said P-type polysilicon film is not overetched during said step (d).

5. The method according to claim 4, wherein said step of introducing said N-type impurity into said part of said P-type polysilicon film is an implantation of ions of a material taken from a group consisting of phosphorus and arsenic, with a dose of at least $1\times10^{15}$ cm$^{-2}$.

6. The method according to claim 4, wherein said step of removing said N-type portion of said polysilicon film is performed by a reactive ion etching using a gas selected from the group consisting of a $Cl_2$ gas, mixed gases of $Cl_2$ and $BCl_3$, mixed gases of $Cl_2$ and HBr, mixed gases of $Cl_2$ and $BBr_3$, and mixed gases of $Cl_2$ and $SiCl_4$.

7. A method of manufacturing a semiconductor device comprising the steps of:

(a) forming a P-type polysilicon film on and in contact with a major surface of a single-crystal silicon substrate;

(b) forming a mask layer on said P-type polysilicon film, said mask layer having a window therein which exposes said P-type polysilicon film;

(c) selectively introducing an N-type impurity into said P-type polysilicon film via said window of said mask layer in order to form an N-type region in said P-type polysilicon film, said N-type region extending through the entire thickness of said P-type polysilicon film;

(d) selectively etching said N-type region of said P-type polysilicon film through said window in said mask layer, said etch continuing until said major surface of said substrate is exposed to form an opening in said polysilicon film;

(e) selectively introducing a P-type impurity into said substrate to form a P-graft base region of a bipolar transistor in an area surrounding said opening of said P-type polysilicon film;

(f) selectively introducing a P-type impurity through said opening and into said substrate to form a P-active base region of said bipolar transistor, said P-active base region being connected to said P-graft base region;

(g) making a sidewall spacer on a side face of said opening in said P-type polysilicon film; and (h) selectively introducing an N-type impurity into said P-active base region to form an N-type emitter region of said bipolar transistor using said sidewall spacer;

wherein said N-type region of said P-type polysilicon film has an etching rate which is greater than an etch rate of said P-type polysilicon film so that the etching rate difference between said N-type region and said substrate becomes greater than an etch rate between said P-type polysilicon film itself and said substrate;

whereby said major surface of said substrate which is exposed by said opening of said P-type polysilicon film is not overetched during said step (d).

8. The method according to claim 7, wherein said step of introducing said N-type impurity into said exposed portion of said P-type polysilicon film is an implantation of ions of a material taken from a group consisting of phosphorus and arsenic, with a dose of at least $1\times10^{15}$ cm$^{-2}$.

9. The method according to claim 7, wherein said step of etching said N-type portion of said P-type polysilicon film is performed by a reactive ion etching using a gas selected from the group consisting of a $Cl_2$ gas, mixed gases of $Cl_2$ and $BCl_3$, mixed gases of $Cl_2$ and HBr, mixed gases of $Cl_2$ and $BBr_3$, and mixed gases of $Cl_2$ and $SiCl_4$.

\* \* \* \* \*